(12) United States Patent
Wang

(10) Patent No.: US 10,158,951 B2
(45) Date of Patent: Dec. 18, 2018

(54) SILICON MICROPHONE WITH SUSPENDED DIAPHRAGM AND SYSTEM WITH THE SAME

(71) Applicant: GOERTEK INC., WeiFang, Shandong (CN)

(72) Inventor: Zhe Wang, WeiFang (CN)

(73) Assignee: GOERTEK INC., Weifang, Shandong (CN)

( * ) Notice: Subject to any disclaimer, the term of this patent is extended or adjusted under 35 U.S.C. 154(b) by 0 days.

(21) Appl. No.: 15/307,301

(22) PCT Filed: Jun. 27, 2014

(86) PCT No.: PCT/CN2014/080990
§ 371 (c)(1),
(2) Date: Oct. 27, 2016

(87) PCT Pub. No.: WO2015/196468
PCT Pub. Date: Dec. 30, 2015

(65) Prior Publication Data
US 2017/0055085 A1 Feb. 23, 2017

(51) Int. Cl.
*B81B 3/00* (2006.01)
*H04R 19/04* (2006.01)
*H04R 19/00* (2006.01)

(52) U.S. Cl.
CPC ............ *H04R 19/04* (2013.01); *B81B 3/001* (2013.01); *B81B 3/0051* (2013.01);
(Continued)

(58) Field of Classification Search
None
See application file for complete search history.

(56) References Cited

U.S. PATENT DOCUMENTS

| 6,012,336 A | 1/2000 | Eaton et al. |
| 2008/0075308 A1* | 3/2008 | Wei ............... H04R 19/005 |
| | | 381/175 |
| 2012/0319174 A1* | 12/2012 | Wang ............. B81C 1/00246 |
| | | 257/254 |

FOREIGN PATENT DOCUMENTS

| CN | 1787693 A | 6/2006 |
| CN | 102822084 A | 12/2012 |

(Continued)

OTHER PUBLICATIONS

International Search Report dated Dec. 30, 2014 for International Application No. PCT/CN2014/080990.
(Continued)

*Primary Examiner* — Cory W Eskridge
(74) *Attorney, Agent, or Firm* — Howard & Howard Attorneys PLLC

(57) ABSTRACT

A silicon microphone with a suspended diaphragm and a system with the same are provided, the microphone comprises: a silicon substrate provided with a back hole therein; a compliant diaphragm disposed above the back hole of the silicon substrate and separated from the silicon substrate; a perforated backplate disposed above the diaphragm with an air gap sandwiched in between; and a precisely defined support mechanism, disposed between the diaphragm and the backplate with one end thereof fixed to the edge of the diaphragm and the other end thereof fixed to the backplate, wherein the diaphragm and the backplate are used to form electrode plates of a variable condenser. The microphone with a suspended diaphragm can improve the repeatability and reproducibility in performance and can reduce the diaphragm stress induced by the substrate.

10 Claims, 3 Drawing Sheets

(52) U.S. Cl.
CPC ......... *B81B 3/0072* (2013.01); *H04R 19/005* (2013.01); *B81B 2201/0257* (2013.01); *B81B 2203/0127* (2013.01); *B81B 2203/04* (2013.01); *B81B 2207/015* (2013.01); *B81C 2203/0714* (2013.01); *H04R 2201/003* (2013.01)

(56) References Cited

FOREIGN PATENT DOCUMENTS

| | | |
|---|---|---|
| CN | 102932724 A | 2/2013 |
| CN | 202957976 U | 5/2013 |
| CN | 202957977 U | 5/2013 |
| JP | 2007-267081 A | 10/2007 |
| WO | 9823934 A1 | 6/1998 |
| WO | 0215636 A2 | 2/2002 |
| WO | 2012012939 A1 | 2/2012 |

OTHER PUBLICATIONS

English Translation of Chinese Office Action with Original Chinese Document, CN Serial No. 2017111301638790, dated Nov. 16, 2017.

\* cited by examiner

SILICON MICROPHONE WITH SUSPENDED DIAPHRAGM AND SYSTEM WITH THE SAME

FIELD OF THE INVENTION

The present invention relates to the field of microphone technology, and more specifically, to a silicon microphone with a suspended diaphragm and a system with the same.

BACKGROUND

Silicon microphones, or silicon based MEMS microphones, also known as acoustic transducers, have been in research and development for many years. The silicon microphones may be widely used in many applications, such as cell phones, tablet PCs, cameras, hearing aids, smart toys and surveillance devices due to their potential advantages in miniaturization, performances, reliability, environmental endurance, costs and mass production capability.

In general, a silicon microphone consists of a fixed perforated backplate and a highly compliant diaphragm with an air gap formed in between. The perforated backplate and the compliant diaphragm, forming a variable air-gap condenser, are typically formed on a single silicon substrate, with one of which being directly exposed to the outside through a back hole formed in the silicon substrate.

Patent application No. WO 02/15636 discloses an acoustic transducer, which has a substrate formed with a back hole therein, a diaphragm made of low stress polysilicon and directly positioned above the back hole of the substrate, and a cover member (equivalent to the said backplate) disposed above the diagram. The diaphragm can be laterally movable within its own plane parallel to the planar surface of the cover member, and thus can release its intrinsic stress, resulting very consistent mechanical compliance.

Patent document PCT/DE97/02740 discloses a miniaturized microphone, in which an SOI substrate is used for formation of the microphone and related CMOS circuits. Specifically, the silicon layer of the SOI substrate is used to form the backplate of the microphone which is directly above a back hole formed in the SOI substrate, while a subsequently deposited polysilicon thin film, serving to be the diaphragm of the microphone, is located above the backplate with an air gap in between and exposed to the outside through both the openings in the perforated backplate and the back hole in the SOI substrate.

FIG. 1 shows a cross-sectional view of an exemplary structure of a conventional silicon microphone. As shown in FIG. 1, the conventional silicon microphone 10 comprises a silicon substrate 100 provided with a back hole 140 therein, a conductive and compliant diaphragm 200 stacked on the silicon substrate 100 with an oxide layer 120 sandwiched in between and serving as an electrode as well as a vibration membrane, a perforated backplate 400 located above the diaphragm 200 and formed with CMOS passivation layers with a metal layer 400b imbedded therein which serves as an electrode plate of the backplate 400, and an air gap 150 provided between the diaphragm 200 and the backplate 400 and with a spacer 300 forming the boundary thereof. The diaphragm 200 and electrode plate of the backplate 400 forms a variable condenser, which has an extraction electrode 410 for the diaphragm 200 and an extraction electrode 420 for the backplate 400. More details of the conventional microphone 10 are described in the international application No. PCT/CN2010/075514 and omitted herein for sake of conciseness.

As can be seen from the structure of the above described silicon microphone 10, the diaphragm 200 is defined by and exposed to the outside through the back hole 140 formed in the substrate 100 by a wet etching or dry etching process. Since the silicon substrate 100 has a typical thickness of, for example, 400 µm or more, and the achievable precision of the back hole wet etching or dry etching of the substrate 100 is typically at ±20 µm, there exists a problem with the conventional silicon microphone 10 that the imprecise back hole etching process would cause a variation in the vibrating area of the diaphragm 200 (i.e. the area shown between two vertical dash lines in FIG. 1), and thus cause a variation in the sensitivity of the silicon microphone 10, which renders the silicon microphone 10 a low repeatability and reproducibility in performance.

SUMMARY

In order to solve the above problem, the present invention provides a silicon microphone with a suspended diaphragm and a system with the same, which may help to accurately define the vibrating area of the diaphragm of a silicon microphone and thus improve the repeatability and reproducibility of the silicon microphone.

In one aspect of the present invention, there is provided a silicon microphone with a suspended diaphragm, comprising: a silicon substrate provided with a back hole therein; a compliant diaphragm disposed above the back hole of the silicon substrate and separated from the silicon substrate; a perforated backplate disposed above the diaphragm with an air gap sandwiched in between; and a precisely defined support mechanism, disposed between the diaphragm and the backplate with one end thereof fixed to the edge of the diaphragm and the other end thereof fixed to the backplate, wherein the diaphragm and the backplate are used to form electrode plates of a variable condenser.

Preferably, the support mechanism may include a plurality of separate supports circumferentially positioned on the edge of the diaphragm, or preferably, the support mechanism may include a ring-shaped support positioned on the edge of the diaphragm.

Furthermore, the support mechanism may be made of stacked layers of one or more materials selected from a group consisting of metals, semiconductors and insulators.

Also, the silicon microphone with a suspended diaphragm may further comprise an interconnection column provided in the support mechanism for electrically wiring out the diaphragm.

Also, the silicon microphone with a suspended diaphragm may further comprise dimples protruding from the lower surface of the perforated backplate opposite to the diaphragm.

Preferably, said compliant diaphragm may be formed with a part of a silicon device layer or a polysilicon layer stacked on the silicon substrate with an oxide layer sandwiched in between.

Preferably, said perforated backplate may be formed with CMOS passivation layers with a metal layer imbedded therein which serves as an electrode plate of the backplate, or preferably, said perforated backplate may be formed with a polysilicon layer or a SiGe layer.

In another aspect of the present invention, there is provided a microphone system, comprising the silicon microphone with a suspended diaphragm as described above and a CMOS circuitry integrated on a single chip.

As can be seen from above description, in the silicon microphone according to the present invention, the diaphragm is separated from the substrate and supported by the support mechanism, which means that the vibrating area of the diaphragm is constrained by the support mechanism rather than by the back hole formed in the substrate, therefore, the processing precision of the support mechanism, which is less than 1 μm, instead of the processing precision of the back hole, which is at about 20 μm, determines the variation in the vibrating area of the diaphragm, which cause a great improvement in the performance consistency of the silicon microphone, and thus renders the silicon microphone according to the present invention a much higher yield rate. Additionally, since the diaphragm of the microphone according to the present invention is suspended, the diaphragm stress induced by the substrate as it is in a conventional microphone no longer exists in the microphone according to the invention and affects the performance thereof.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE DRAWINGS

The objectives and features of the present invention will become apparent from the following description of embodiments, given in conjunction with the accompanying drawings, in which.

DETAILED DESCRIPTION

Figure 1:
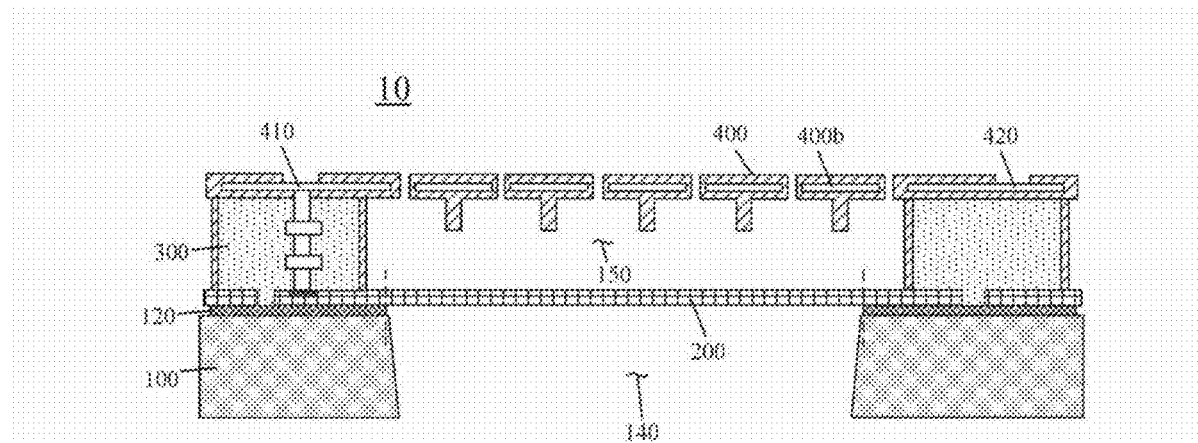
FIG. 1 is a cross-sectional view showing an exemplary structure of a conventional silicon microphone.

Various aspects of the claimed subject matter are now described with reference to the drawings, wherein the illustrations in the drawings are schematic and not to scale, and like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

In the description and the appended claims, it will be understood that, when a layer, a region, or a component is referred to as being "on" or "under" another layer, another region, or another component, it can be "directly" or "indirectly" on or under the another layer, region, or component, or one or more intervening layers may also be present.

Figure 2:
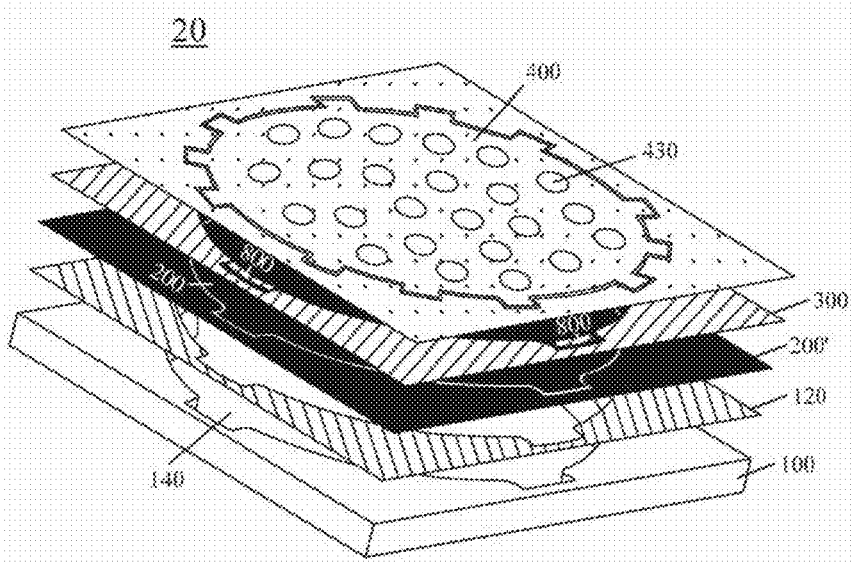
FIG. 2 is an exploded view schematically showing the layer structure of the silicon microphone with a suspended diaphragm according to the first embodiment of the present invention.
Figure 3:
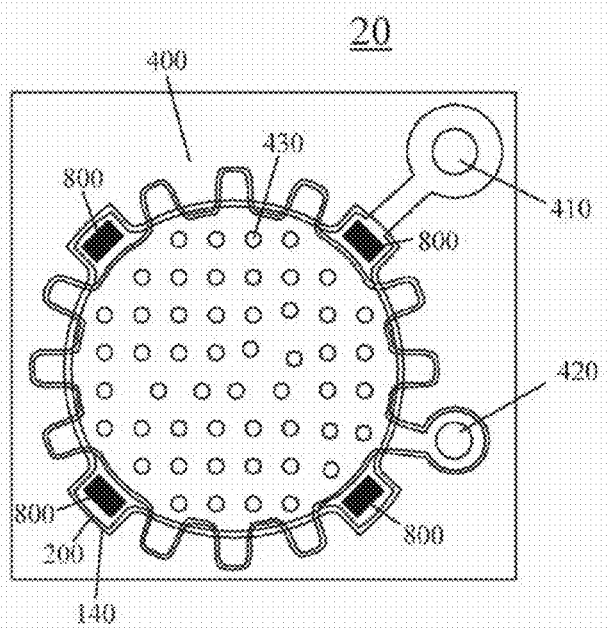
FIG. 3 is a top view schematically showing in a plane the laminated layers of the silicon microphone of FIG. 2.
Figure 4:
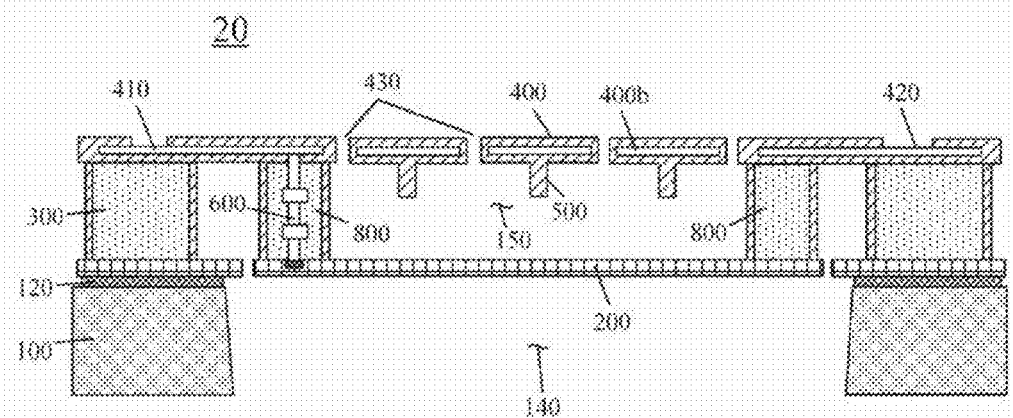
FIG. 4 is a cross-sectional view showing the structure of the silicon microphone of FIG. 2.

FIG. 2 is an exploded view schematically showing the layer structure of the silicon microphone with a suspended diaphragm according to the first embodiment of the present invention, FIG. 3 is a top view schematically showing in a plane the laminated layers of the silicon microphone of FIG. 2, and FIG. 4 is a cross-sectional view showing the structure of the silicon microphone of FIG. 2. As shown in FIG. 2 to FIG. 4, the silicon microphone 20 with a suspended diaphragm according to the first embodiment of the present invention mainly comprises: a silicon substrate 100 provided with a back hole 140 therein; a compliant diaphragm 200 disposed above the back hole 140 of the silicon substrate 100 and separated from the silicon substrate 100; a perforated backplate 400 disposed above the diaphragm 200 with an air gap 150 sandwiched in between; and a precisely defined support mechanism 800, disposed between the diaphragm 200 and the backplate 400 with one end thereof fixed to the edge of the diaphragm 200 and the other end thereof fixed to the backplate 400. The diaphragm 200 and the backplate 400 are used to form electrode plates of a variable condenser, which may receive an acoustic signal and transform the received acoustic signal into an electrical signal for the subsequent processing and output.

In more details, the diaphragm 200 may be formed with a part of a silicon device layer such as the top-silicon film on a silicon-on-insulator (SOI) wafer or formed with a polycrystalline silicon (or polysilicon) membrane through a deposition process, and stacked on the silicon substrate 100 with an oxide layer 120 sandwiched in between.

The perforated backplate 400 may be formed with CMOS passivation layers with a metal layer 400b imbedded therein which serves as an electrode plate of the backplate 400. In another example, the perforated backplate 400 may be formed with a polysilicon layer or a low temperature SiGe layer.

The air gap 150 is formed between the diaphragm 200 and the backplate 400 with a spacer 300 forming the boundary thereof. The conductive and compliant diaphragm 200 serves as an electrode, as well as a vibration membrane which vibrates in response to an external acoustic wave or a sound pressure impact reaching the diaphragm 200 through the back hole 140. The backplate 400 provides another electrode of the microphone 20, and has a plurality of through holes 430 formed therein, which are used for air ventilation so as to reduce air damping that the diaphragm 200 will encounter when starts vibrating.

In the silicon microphone 20 according to the first embodiment of the present invention, the support mechanism 800 includes a plurality of separate supports circumferentially positioned on the edge of the diaphragm 200. Since the diaphragm 200 is separated from the substrate 100 to form a suspended diaphragm and supported by the support mechanism 800 connected to the backplate 400, the vibrating area of the suspended diaphragm 200 is solely constrained by the support mechanism 800.

On the other hand, compared with the substrate 100 made of silicon and having a thickness of about 400 μm, the support mechanism 800 may be formed with a CMOS dielectric silicon oxide layer and may have a thickness of several micrometers, thus, unlike the back hole 140 formed in the substrate 100 with a precision of about 20 μm, the support mechanism 800 can be precisely defined by an oxide wet etching process with a processing precision of less than 1 μm. Therefore, the silicon microphone 20 according to the present invention, which has its diaphragm 200 constrained by the support mechanism 800 instead of the back hole 140 of the silicon substrate 100, may have a highly consistent performance, such as sensibility.

In other examples, the support mechanism 800 may be made of stacked layers of one or more materials selected from a group consisting of metals (such as copper, aluminum, titanium and so on), semiconductors (such as poly silicon) and insulators (such as the CMOS dielectric silicon oxide including LPCVD or PEVCD oxide, PSG or BPSG oxide or a combination thereof, the CMOS passivation materials including PECVD silicon nitride, and so on).

Furthermore, the silicon microphone 20 according to the first embodiment of the invention may further include an interconnection column 600 provided in the support mechanism 800 for electrically wiring out the diaphragm 200. And, the silicon microphone 20 according to the first embodiment of the invention may have an extraction electrode 410 for the diaphragm 200 and an extraction electrode 420 for the backplate 400.

Also, the silicon microphone 20 according to the first embodiment of the invention may further include dimples 500 protruding from the lower surface of the perforated backplate 400 opposite to the diaphragm 200, and used to prevent the diaphragm 200 from sticking to the backplate 400.

It should be noted that, for sake of clearness, the extraction electrode 410 and the extraction electrode 420 are omitted in the FIG. 2, while the oxide layer 120, the non-diaphragm part of the diaphragm layer 200' and the spacer 300 are omitted in FIG. 3.

The method of fabricating the silicon microphone 20 according to the present invention may be easily envisaged with reference to the international application No. PCT/CN2010/075514, and thus omitted herein for sake of brevity.

Figure 5:
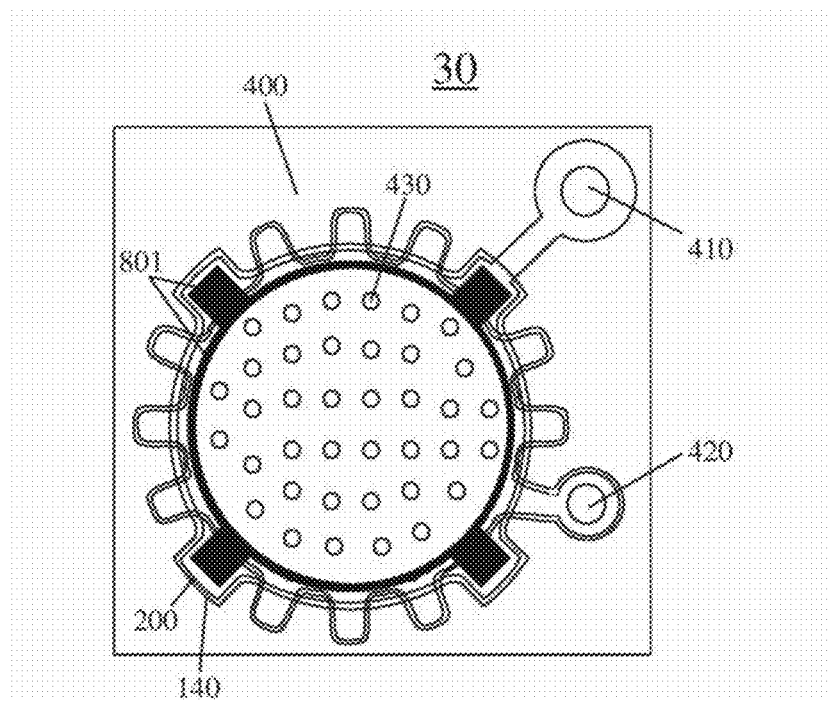
FIG. 5 is a top view schematically showing in a plane the laminated layers of the silicon microphone according to the second embodiment of the present invention.

It should be noted that the structure and the shape of the support mechanism according to the present invention is not limited to those of the support mechanism 800 described above. FIG. 5 is a top view schematically showing in a plane the laminated layers of the silicon microphone according to the second embodiment of the present invention, and FIG. 6 is a top view schematically showing in a plane the laminated layers of the silicon microphone according to the third embodiment of the present invention.

Figure 6:
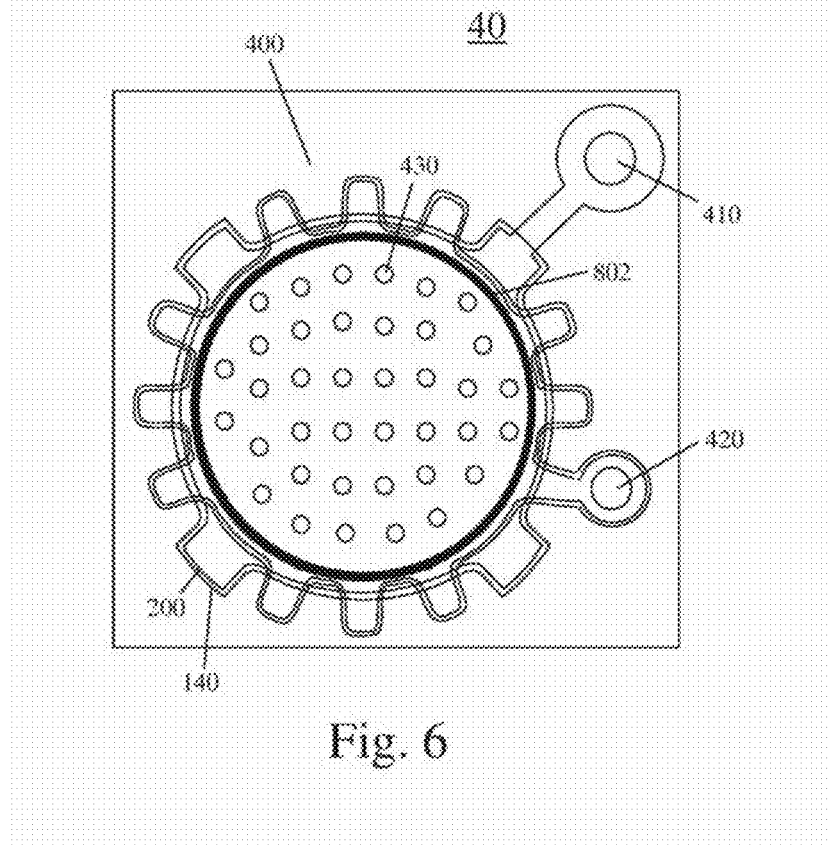
FIG. 6 is a top view schematically showing in a plane the laminated layers of the silicon microphone according to the third embodiment of the present invention.

Comparing FIG. 5 and FIG. 6 with FIG. 3, the silicon microphone 30 with a suspended diaphragm according to the second embodiment and the silicon microphone 40 with a suspended diaphragm according to the third embodiment are distinguished from that of the first embodiment in that, the support mechanism 801 in the second embodiment and the support mechanism 802 in the third embodiment include a ring-shaped support positioned on the edge of the diaphragm 200.

Furthermore, any silicon microphone with a suspended diaphragm according to the present invention can be integrated with a CMOS circuitry on a single chip to form a microphone system.

As can be seen from above description, in the silicon microphone according to the present invention, the diaphragm is separated from the substrate and supported by the support mechanism, which means that the vibrating area of the diaphragm is constrained by the support mechanism rather than by the back hole formed in the substrate, therefore, the processing precision of the support mechanism, which is less than 1 μm, instead of the processing precision of the back hole, which is at about 20 μm, determines the variation in the vibrating area of the diaphragm, which cause a great improvement in the performance consistency of the silicon microphone, and thus renders the silicon microphone according to the present invention a much higher yield rate. Additionally, since the diaphragm of the microphone according to the present invention is suspended, the diaphragm stress induced by the substrate as it is in a conventional microphone no longer exists in the microphone according to the present invention and affects the performance thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

The invention claimed is:

1. A silicon microphone with a suspended diaphragm, comprising:
    a silicon substrate provided with a back hole therein;
    a compliant diaphragm disposed above the back hole of the silicon substrate and separated from the silicon substrate;
    a perforated backplate disposed above the diaphragm with an air gap sandwiched in between;
    a spacer forming a boundary of the air gap; and
    a support mechanism, circumferentially positioned on the edge of the diaphragm and disposed between the diaphragm and the backplate with one end thereof physically connected and fixed to the edge of the diaphragm and the other end thereof physically connected and fixed to the backplate to allow a vibrating area of the diaphragm to be solely constrained by the support mechanism,
    wherein the back hole is formed with a lateral dimension error of about 20 μm, and the support mechanism is defined with a lateral dimension error of less than 1 μm,
    wherein the diaphragm and the backplate are used to form electrode plates of a variable condenser.

2. A silicon microphone with a suspended diaphragm of claim 1, wherein the support mechanism includes a plurality of separate supports.

3. A silicon microphone with a suspended diaphragm of claim 1, wherein the support mechanism includes a ring-shaped support.

4. A silicon microphone with a suspended diaphragm of claim 1, wherein the support mechanism is made of stacked layers of one or more materials selected from a group consisting of metals, semiconductors and insulators.

5. A silicon microphone with a suspended diaphragm of claim 1, further comprising an interconnection column provided in the support mechanism for electrically wiring out the diaphragm.

6. A silicon microphone with a suspended diaphragm of claim 1, further comprising dimples protruding from the lower surface of the perforated backplate opposite to the diaphragm.

7. A silicon microphone with a suspended diaphragm of claim 1, wherein, said compliant diaphragm is formed with a part of a silicon device layer or a polysilicon layer stacked on the silicon substrate with an oxide layer sandwiched in between.

8. A silicon microphone with a suspended diaphragm of claim 1, wherein, said perforated backplate is formed with CMOS passivation layers with a metal layer imbedded therein which serves as an electrode plate of the backplate.

9. A silicon microphone with a suspended diaphragm of claim 1, wherein said perforated backplate is formed with a polysilicon layer or a SiGe layer.

10. A microphone system, comprising the silicon microphone with a suspended diaphragm of claim 1 and a CMOS circuitry integrated on a single chip.

* * * * *